(12) United States Patent
Chan et al.

(10) Patent No.: US 6,268,276 B1
(45) Date of Patent: Jul. 31, 2001

(54) AREA ARRAY AIR GAP STRUCTURE FOR INTERMETAL DIELECTRIC APPLICATION

(75) Inventors: Lap Chan, San Francisco, CA (US); Kheng Chok Tee, Selanger (MY); Kok Keng Ong; Chin Hwee Seah, both of Singapore (SG)

(73) Assignees: Chartered Semiconductor Manufacturing Ltd.; Nanyang Technological University of Singapore, both of Singapore (SG)

( * ) Notice: Subject to any disclaimer, the term of this patent is extended or adjusted under 35 U.S.C. 154(b) by 0 days.

(21) Appl. No.: 09/216,823

(22) Filed: Dec. 21, 1998

(51) Int. Cl.[7] .................. H01L 21/4763; H01L 21/76
(52) U.S. Cl. .................. 438/619; 438/411; 438/421; 438/618; 438/627
(58) Field of Search ...................... 438/619, 618, 438/421, 411, 622, 627, 412; 437/180, 195

(56) References Cited

U.S. PATENT DOCUMENTS

| 5,324,683 | 6/1994 | Fitch et al. ............... 437/65 |
| 5,407,860 | 4/1995 | Stoltz et al. ............. 437/180 |
| 5,461,003 | 10/1995 | Havemann et al. ....... 437/187 |
| 5,599,745 | 2/1997 | Reinberg ................. 437/195 |
| 5,750,415 | 5/1998 | Gnade et al. ............ 437/195 |
| 5,792,706 | 8/1998 | Michael et al. .......... 438/626 |

Primary Examiner—Matthew Smith
Assistant Examiner—Lex H. Malsawma
(74) Attorney, Agent, or Firm—George O. Saile; Rosemary L.S. Pike

(57) ABSTRACT

A new method of forming air gaps between adjacent conducting lines of a semiconductor circuit by using a "holes everywhere" or a "reverse metal holes" mask that can be used to create holes in a dielectric layer. The dielectric that is being etched has been deposited across conducting lines, the holes that are being formed in this manner are closed by depositing a dielectric across the top of the holes. The holes can be etched across the entire layer of the deposited dielectric or can be etched in between the conducting lines.

35 Claims, 2 Drawing Sheets

AREA ARRAY AIR GAP STRUCTURE FOR INTERMETAL DIELECTRIC APPLICATION

FIELD OF THE INVENTION

The invention relates to the fabrication of Integrated Circuit devices and more specifically to the formation of air gaps as a low dielectric constant material between conductor lines on the same or on different levels.

DESCRIPTION OF THE PRIOR ART

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The continuing effort to reduce the size of individual transistors and other devices commonly integrated on a semiconductor chip and to increase the density of Integrated Circuits results in a continuing reduction of the separation between conducting layers of materials. This reduction results in an increase of capacitive crosstalk between adjacent conductor lines of a semiconductor circuit, that is the voltage on the first conductor line alters or affects the voltage on the second conductor line. This alteration in voltage can cause erroneous voltage levels in the Integrated Circuit making the IC increasingly prone to faulty operation. It becomes therefore imperative to reduce the resistance capacitance (RC) time constant and the crosstalk between adjacent conducting lines.

The capacitance between adjacent conducting lines is highly dependent on the insulator or dielectric used to separate the conducting lines. Conventional semiconductor fabrication typically uses silicon dioxide as a dielectric; this has a dielectric constant of about 3.9.

The use of many of the low dielectric constant materials is not feasible due to the fact that equipment is not available to properly process the new dielectric material in various integrated circuits. Also, the chemical or physical properties of many low dielectric constant materials are usually difficult to make compatible with or integrate into conventional integrated circuit processing.

The lowest possible and therefore the ideal dielectric constant is 1.0, this is the dielectric constant of a vacuum whereas air has a dielectric constant of slightly larger than 1.0.

To reduce said capacitive coupling and reduce the capacitive crosstalk, a major objective in the design of IC's is to reduce the Dielectric Constant (k) of the insulating layer between adjacent conductor lines of semiconductor circuits. The present invention makes a significant contribution within the scope of this effort.

U.S. Pat. No. 5,792,706 (Michael et al.) shows a method of forming Air Gaps 26 between metal lines 11 by (1) patterning a dielectric layer 20 using a PR mask (e.g., reverse metal mask or a holes anywhere mask) and (2) forming a capping dielectric layer 32 thereover to close up the air gaps. This patent appears to show the invention. See claim 1, see FIG. 7; FIGS. 1–9; See col. 6, lines 11 to 56. Michael appears to show the invention's (a) modified reverse metal mask, see FIGS. 8 and 9, and a "holes everywhere" mask, see FIG. 4, 6, and 7. This patent is claimed broadly.

U.S. Pat. No. 5,324,683 (Fitch et al.), U.S. Pat. No. 5,407,860 (Stotlz et al.) and U.S. Pat. No. 5,461,003 (Havemann et al.) and U.S. Pat. No. 5,599,745 (Reinberg) show methods to form air gaps.

U.S. Pat. No. 5,750,415 (Gnade et al.) U.S. Pat. No. 5,792,706 (Michael et al.) and U.S. Pat. No. 5,407,860 (Stotz et al.) show air gap processes.

SUMMARY OF THE INVENTION

The principle object of the present invention is to provide and effective and manufacturable method of forming air gaps between conductive layers of material.

Another objective of the present invention is a method of reducing the dielectric constant k between conductive layers of material.

Another objective of the present invention is a method of reducing capacitive coupling between conducting layers of material.

Another objective of the present invention is a method of reducing capacitive crosstalk between conductive layers of material.

Another objective of the present invention is to reduce the potential for false or incorrect logic levels of the circuits in the IC's.

Another objective of the present invention is a method of reducing Resistance Capacitance delays of the circuits in the IC's.

Another objective of the present invention is to increase Switching Speed of the circuits in the IC's.

In accordance with the objects of the present invention a new method of forming air gaps between adjacent conducting lines of a semiconductor circuit is achieved. Key to the present invention is the use of a "holes everywhere" mask that can be used to create holes in a dielectric layer via standard etching techniques. The dielectric that is being etched has been deposited as a layer across the metal or conducting lines, the holes that are being formed in this manner can be closed of by a high pressure or high temperature Chemical Vapor Deposition process. The highlighted holes can be etched across the entire layer of the deposited dielectric or, if the "holes everywhere" mask is used in combination with a reverse metal mask, can be etched in between the metal or conducting lines.

DETAILED DESCRIPTION OF THE PREFERRED EMBODIMENTS

The present invention teaches the forming of air gaps within a low k dielectric layer deposited across a layer of conducting lines. The layer of conducting lines has been deposited on top of a base layer and can exist at any level within the structure of the semiconductor device.

In the first embodiment of the present invention the mask used to etch the openings of the low k dielectric layer is a "openings everywhere" mask. This results in openings being etched in between the conducting lines and within the layer of the low k dielectric that covers the conducting lines.

In the second embodiment of the present invention the mask used to etch the openings of the low k dielectric layer is a "reverse metal hole" mask. This results in openings being etched in between the conducting lines.

Figure 1:
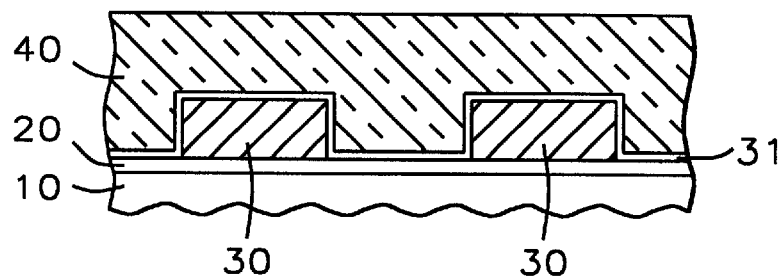
FIG. 1 shows a pattern of metal lines deposited on top of a base layer. A sacrificial etch stopper such as $Si_3N_4$ is deposited on top of the metal lines.

Referring now specifically to FIG. 1, there is shown a cross section of a semiconductor substrate 10, a base layer 20 formed on the top surface of the substrate 10, the pattern of conducting lines 30 on which a sacrificial layer 31 of $Si_3N_4$ (which serves as a etch stopper) and a layer of low k dielectric 40 has been deposited. A sacrificial layer of $Si_3N_4$ can also serve as a liner for low k dielectric materials. The techniques used for the features and elements within this cross section are all manufactured using standard semiconductor techniques. Base layer 20 is highlighted in FIG. 1 to indicated that the method of the present invention can be applied at any layer within the assemblage of layers that constitute a semiconductor circuit without being limited to application directly on top of the semiconductor substrate.

Figure 2:
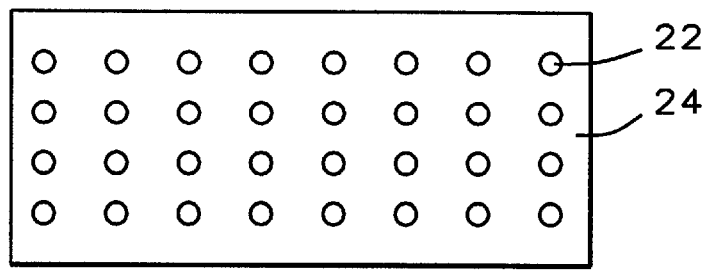
FIG. 2 shows the "holes everywhere" mask.

FIG. 2 shows a top view of an "all holes" mask 24. The mask 24 shown contains a 4 by 8 array of openings 22. This array is shown only as an example, practical applications of the present invention will select an array configuration that is required for the application.

Figure 3:
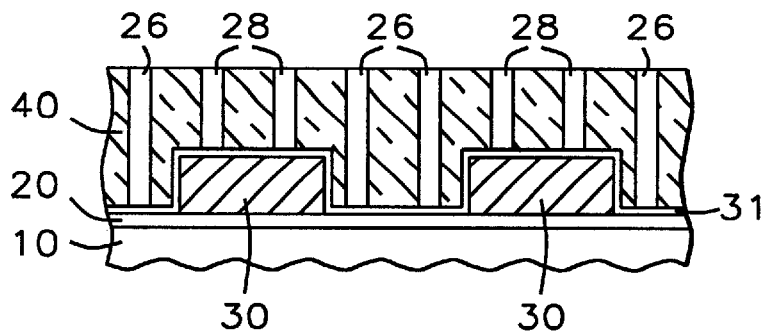
FIG. 3 shows the pattern of the holes created by using the "holes everywhere" mask before closing of the holes.

FIG. 3 shows a cross section of the semiconductor substrate 10, now with the openings 26 and 28 etched into the low k dielectric layer 40 using the "all holes" mask. It is to be noted that opening 26 penetrate from the top surface of the low k dielectric layer 40 all the way down to the surface of the etch stopper layer 31. This is the same for openings 28; these openings penetrate from the top surface of the low k dielectric layer 40 to the top surface of the etch stopper layer 31. From this it is apparent that openings 26 serve as main conduits for forming the air gaps between the metal lines 30.

Figure 4:
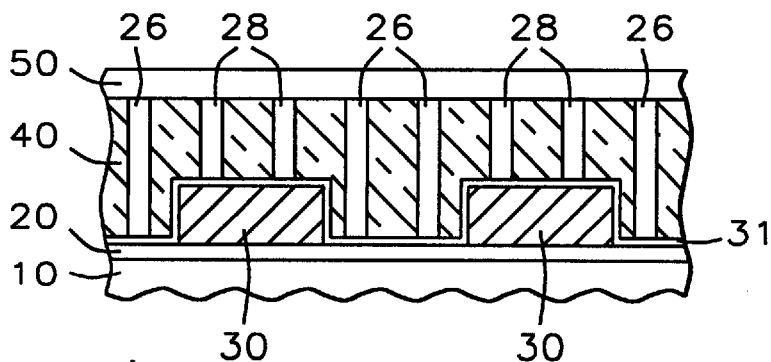
FIG. 4 shows the pattern of the holes created by using the "holes everywhere" mask after closing of the holes.

FIG. 4 shows a cross section of the semiconductor construct after the openings 26 and 28 have been closed. This closing of the holes is achieved by performing a high pressure or a high temperature Chemical Vapor Deposition of a dielectric layer 50 on top of the low k dielectric layer 40.

Layer 50 serves as a cap layer for the low k dielectric materials to minimize metal corrosion. If necessary a sandwich of dielectric can be used to enhance the closing of the holes. Layer 50 can contain $SiO_2$, $SiO_2/Si_3N_4$ or $Si_3N_4/SiO_2$. The structure of layer 50 is selected such that it has good mechanical strength and good mechanical adhesion, comparable to $SiO_2$.

Figure 5:
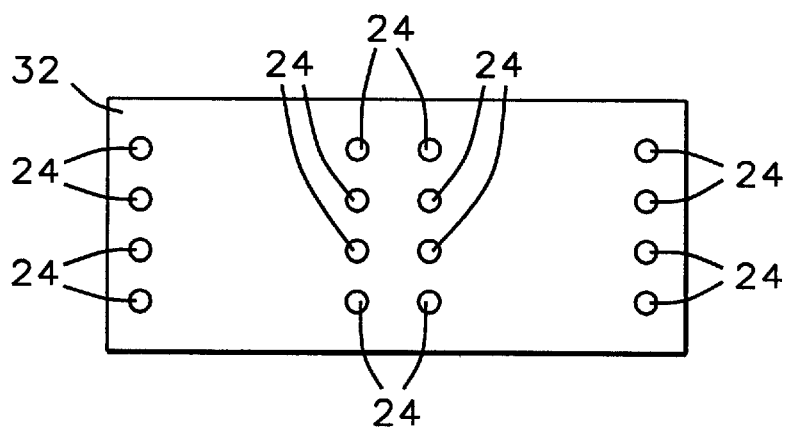
FIG. 5 shows the "reverse metal hole" mask.

FIG. 5 shows an "reverse metal hole" mask 32. Again the mask 32 shown merely serves as an illustrative example. It is to be noted that the holes 24 are present only in the areas of the mask that are aligned such that they are above and within the openings between the deposited pattern of metal lines 30. In between the pattern of metal lines 30 the mask has openings 24 and as such allows the etching of holes in between the metal lines 30.

Figure 6:
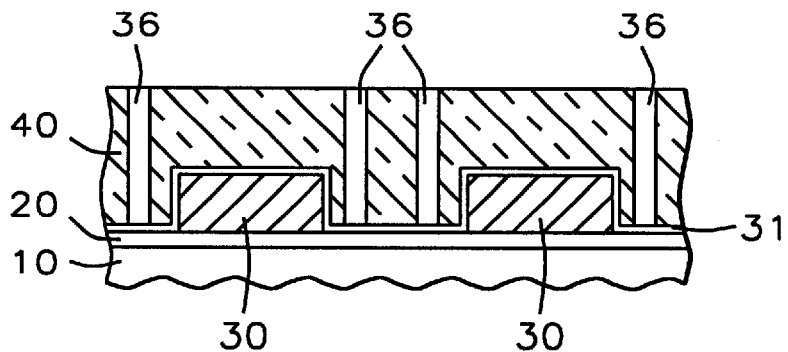
FIG. 6 shows the pattern of the holes created by using the "reverse metal hole" mask before closing of the holes.

FIG. 6 shows the formation of openings 36 within the low k dielectric where the "metal reverse hole" mask 32 (FIG. 5) is used for the etching of the openings 36. It is to be noted that the openings for this procedure are etched only in the areas between the metal lines 30, as such these openings 36 form the main conduits for forming the air gaps between the metal lines 30.

Figure 7:
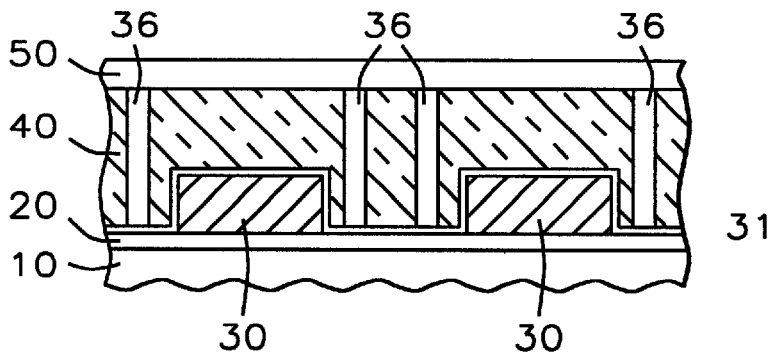
FIG. 7 shows the pattern of the holes created by using the "reverse metal hole" mask after closing of the holes.

FIG. 7 shows a cross section of the semiconductor construct after the holes 36 have been closed. This closing of the holes 36 is achieved by performing a high pressure or a high temperature Chemical Vapor Deposition of a dielectric layer 50 on top of the low k dielectric layer 40. The dialectric layer 50 can be a multiplicity of low-k intra-level dielectric layers.

While the present invention has been described with reference to an illustrative embodiment, this description is not to be construed in a limiting sense. Various modifications and combinations, as well as other embodiments of the invention reference to the description. It is therefore intended that the appended claims encompass any such modifications or embodiments.

What is claimed is:

1. A method for forming air gaps between conducting lines of a semiconductor device, comprising the steps of:
   providing a semiconductor substrate;
   forming a base layer on the surface of said substrate;
   forming a pattern of conducting lines on the surface of said base layer;
   depositing a layer of etch stopping material over said conducting pattern thereby including exposed portions of said base layer ;
   depositing a layer of low k material over said layer of etch stopping material;
   securing a mask;
   exposing and etching a pattern of openings between said conducting lines; and
   depositing a layer of dielectric material.

2. The method of claim 1 wherein said base layer is formed on the top surface of said semiconductor substrate.

3. The method of claim 1 wherein said base layer is formed at any level within the construct of a semiconductor circuit.

4. The method of claim 1 wherein forming a pattern of conducting lines is forming a pattern of metal or conducting lines on top of said base layer whereby said conducting lines having tops and sidewalls with a spacing or gap between said conducting lines, wherein portions of said base layer are being exposed in the areas of said gaps between said conducting lines.

5. The method of claim 1 wherein depositing a layer of material is depositing an etch stopping material and a layer of low k dielectric material on the top surface of said conducting lines and on top of the exposed sections of said base layer thus forming a low-k inter-level dielectric layer, said etch stopping material allowing misalignment of said openings.

6. The method of claim 1 wherein said mask has openings within areas that form a reverse image of said pattern of conducting lines and that extend across the surface of said base layer wherein said openings are suitable to be used for semiconductor exposure and etching procedures.

7. The method of claim 1 wherein said mask has openings across the surface of said base layer wherein said mask is suitable to be used for semiconductor exposure and etching procedures.

8. The method of claim 1 wherein exposing and etching a pattern of openings uses semiconductor exposing and etching techniques therewith exposing and etching said layer of low k dielectric material.

9. The method of claim 1 wherein said dielectric material contains $SiO_2$.

10. The method of claim 1 wherein said dielectric material contains $SiO_2/Si_3N_4$.

11. The method of claim 1 wherein said dielectric material contains $Si_3N_4/SiO_2$.

12. The method of claim 1 wherein said layer of dielectric contains a multiplicity a dielectric layers thereby enhancing the closing of said openings.

13. The method of claim 1 wherein depositing a layer of dielectric material uses high pressure semiconductor Chemical Vapor Deposition techniques whereby said deposition is on top of and overlaying the top surface of said low k dielectric layer and said openings etched with said low k dielectric layer thus forming a low-k inter-level dielectric layer.

14. The method of claim 1 wherein depositing a layer of dielectric material uses high temperature semiconductor Chemical Vapor Deposition techniques whereby said deposition is on top of and overlaying the top surface of said low k dielectric layer and said openings etched with said low k dielectric layer.

15. The method of claim 1 further comprising the step of forming a sacrificial etch stopping layer on the sides of said conducting lines, after said step of etching said conducting lines.

16. The method of claim 1 further comprising the step of forming a sacrificial etch stopping layer between said conducting lines and on top of said exposed portion of said base layer in addition to a sacrificial etch stopping layer on the sidewalls of said conducting lines after said step of etching said conducting lines.

17. The method of claim 16 wherein said sacrificial etch stopping layer contains a silicon nitride.

18. The method of claim 1 wherein said base layer has been deposited over the substrate and contains dielectric materials.

19. A method for forming air gaps between conducting lines of a semiconductor device, comprising the steps of:

providing a semiconductor substrate;

forming a base layer on the surface of said semiconductor substrate;

forming a pattern of conducting lines on top of said base layer;

depositing a layer of sacrificial etch stopping material over said conducting pattern thereby including exposed portions of said base layer;

depositing a first layer of low k dielectric material over said layer of etch stopping material thus forming a low-k inter-level dielectric layer;

securing a mask;

exposing and etching a pattern of openings between said conducting lines in said layer of deposited low k dielectric material down to the level of said base layer and to the top of said conducting lines;

depositing a layer of dielectric on top of said first layer of low k dielectric material thus forming a low-k inter-level dielectric layer; and depositing a second layer of low k dielectric material on top of said low k inter-level dielectric thereby forming a low-k intra-level dielectric layer.

20. The method of claim 19 wherein said base layer is formed on the top surface of said semiconductor substrate.

21. The method of claim 19 wherein said base layer is formed at any level within the construct of a semiconductor circuit.

22. The method of claim 19 wherein forming a pattern of conducting lines on top of said base layer uses semiconductor methods of exposing and etching conducting lines whereby said conducting lines having tops and sidewalls with a spacing or gap between said conducting lines and whereby portions of said substrate base are being exposed in the areas of said gaps between said conducting lines.

23. The method of claim 19 wherein said mask has openings over areas that form a reverse image of said pattern of conducting lines and that extends over the surface of said low k inter-level dielectric layer whereby said mask is suitable for semiconductor exposure techniques.

24. The method of claim 19 wherein said mask has openings that extend over the surface of said low k inter-level dielectric layer whereby said mask is suitable for semiconductor exposure techniques.

25. The method of claim 19 wherein exposing and etching a pattern of openings is uses semiconductor techniques of exposure and etching thereby using said mask that exhibits openings that extend over the entire surface of said deposited layer of low k dielectric material.

26. The method of claim 19 wherein exposing and etching a pattern of openings is using semiconductor techniques of exposure and etching thereby using said mask that exhibits openings over the areas that form the reverse image of said pattern of conducting lines thereby aligning said mask to expose and etch within the areas between said deposited conducting lines.

27. The method of claim 19 wherein depositing a layer of dielectric on top of said first layer of low k dielectric material uses high temperature CVD techniques.

28. The method of claim 19 wherein depositing a layer of dielectric on top of said first layer of low k dielectric material uses high pressure CVD techniques.

29. The method of claim 19 further comprising the step of forming a sacrificial etch stopping layer on the sides of said conducting lines, after said step of etching said conducting lines.

30. The method of claim 19 further comprising the step of forming a sacrificial etch stopping layer between said conducting lines and on top of said exposed portion of said base layer in addition to a sacrificial etch stopping layer on the sidewalls of said conducting lines after said step of etching said conducting lines.

31. The method of claim 30 wherein said sacrificial etch stopping layer contains a silicon nitride.

32. The method of claim 19 wherein said low-k intra-level dielectric layer contains $SiO_2$.

33. The method of claim 19 wherein said low-k intra-level dielectric layer contains $SiO_2/Si_3N_4$.

34. The method of claim 19 wherein said low-k intra-level dielectric layer contains $Si_3N_4/SiO_2$.

35. The method of claim 19 wherein depositing said low-k intra-level dielectric layer is depositing a multiplicity of low-k intra-level dielectric layers thereby enhancing the closing of said openings.

* * * * *